US006428189B1

(12) United States Patent
Hochstein

(10) Patent No.: US 6,428,189 B1
(45) Date of Patent: Aug. 6, 2002

(54) L.E.D. THERMAL MANAGEMENT

(75) Inventor: Peter A. Hochstein, Troy, MI (US)

(73) Assignee: Relume Corporation, Troy, MI (US)

( * ) Notice: Subject to any disclaimer, the term of this patent is extended or adjusted under 35 U.S.C. 154(b) by 86 days.

(21) Appl. No.: 09/685,393

(22) Filed: Oct. 10, 2000

Related U.S. Application Data
(60) Provisional application No. 60/193,531, filed on Mar. 31, 2000.

(51) Int. Cl.[7] .............................................. F21V 29/00
(52) U.S. Cl. ........................ 362/373; 362/227; 362/800
(58) Field of Search ................................. 362/294, 373, 362/227, 555, 800; 257/705, 706, 707, 720

(56) References Cited
U.S. PATENT DOCUMENTS

| | | | | |
|---|---|---|---|---|
| 5,038,255 A | * | 8/1991 | Nishihashi et al. | 362/373 |
| 5,119,174 A | * | 6/1992 | Chen | 362/373 |
| 5,528,474 A | * | 6/1996 | Roney et al. | 362/373 |
| 5,785,418 A | | 7/1998 | Hochstein | 362/373 |
| 5,857,767 A | | 1/1999 | Hochstein | 362/297 |
| 6,045,240 A | | 4/2000 | Hochstein | 362/294 |
| 6,297,959 B1 | * | 10/2001 | Ueno et al. | 257/706 |
| 6,318,886 B1 | * | 11/2001 | Stopa et al. | 362/555 |

OTHER PUBLICATIONS
Led Light Source Clustered High–Flux Emitter Target/Preliminary Data by Hewlett Packard.
High–Flux Emitter, Target/Preliminary Data, by Hewlett Packard.

* cited by examiner

Primary Examiner—Alan Cariaso
(74) Attorney, Agent, or Firm—Howard & Howard

(57) ABSTRACT

A heat dissipater (30) of a metallic or metal material is disposed in parallel relationship to a circuit board (12). The assembly is characterized by the circuit board 12 presenting a hole (32) therethrough and surrounding each of a plurality of LEDs (20, 22 or 24). A heat sink (28) integral with each LED (20, 22 or 24) is disposed in thermal contact with the heat dissipater (30) for conveying heat from the LEDs (20, 22 and 24) to the heat dissipater (30). In other words, each LED (20, 22 or 24) extends through the hole (32) in the circuit board (12) with the light emitting portion or lens (34) extending from one of the surfaces (14 or 16) of the circuit board (12) and the heat sink (28) extending from the other one of the surfaces (14 or 16) of the circuit board (12). A thermal coupling agent (36 or 38) is disposed between the heat sink (28) and the heat dissipater (30) for providing a full thermal path between the heat sink (28) and the heat dissipater (30). In FIG. 3, the first surface (14) of the circuit board (12), with the electrical leads (26) soldered or adhesively attached to the traces (18) thereon, faces the heat dissipater (30). The circuit board (12) is spaced from the heat dissipater (30) and, in FIG. 3, the traces (18) face the heat dissipater. A step in the fabrication of the present invention is the disposing of a thermally insulating cap (40) around the heat sink (28) while disposing the LED (24) on the circuit board (12) to protect the LED from damage during soldering.

14 Claims, 2 Drawing Sheets

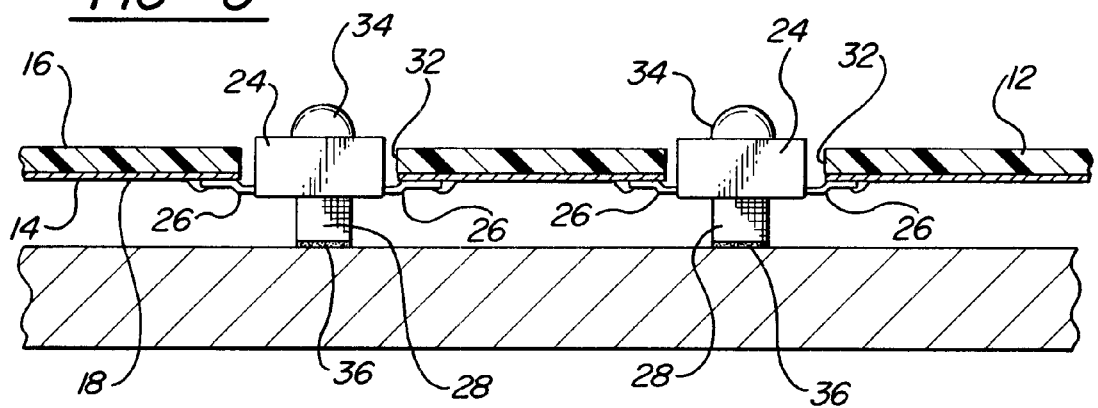
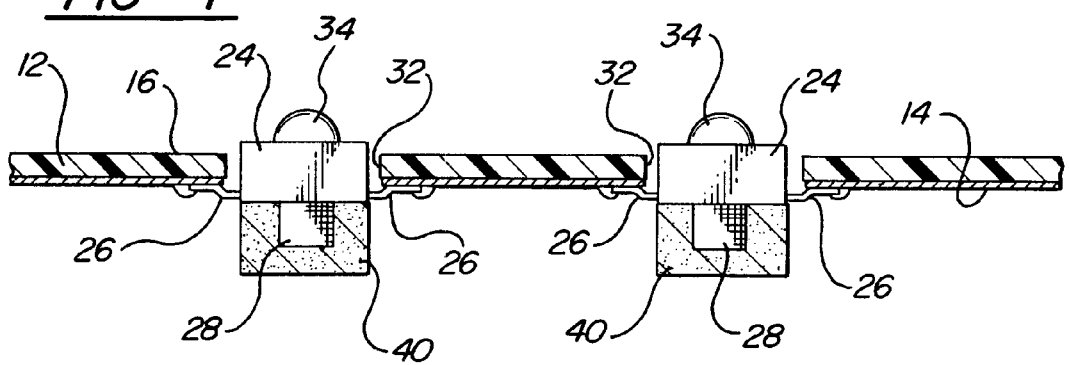

L.E.D. THERMAL MANAGEMENT

This application claims priority from Provisional application Ser. No. 60/193,531, filed Mar. 31, 2000.

BACKGROUND OF THE INVENTION

1. Field of the Invention

The subject invention relates to an electrically driven light-emitting-diode (LED) lamp assembly and a method of fabrication.

2. Description of the Prior Art

Various LED thermal management systems have been devised to improve the heat transfer from the LED to external heat dissipaters. Such systems typically include an electrically insulating circuit board having opposed first and second surfaces with electrically conductive circuit traces on the first surface of the circuit board. A plurality of LEDs have a pair of electrical leads in electrical engagement with the traces. A heat dissipater is disposed in parallel relationship to the circuit board. Examples of such systems are disclosed in U.S. Pat. Nos. 5,785,418; 5,857,767 and 6,045,240 to the inventor named herein.

Conventional LEDs exhibit substantial thermal resistance because of poor thermal coupling with the heat dissipater. That is, the LED is unable to efficiently transmit heat through the leads and into the heat dissipater. Some improvement in thermal performance is possible by making the leads of copper rather than steel. However, mounting problems prevent full advantage of the highly conductive leads. Since most the leads of most LEDs are soldered to the traces on the circuit board, the heat from the soldering process can easily damage the LED if the leads are highly thermally conductive. The aforementioned U.S. Pat. No. 5,857,767 addresses this problem by adhesively attaching the leads of the LED to the traces. Conventional LEDs employ two electrical leads which also serve as the heat conduction path to a heat dissipater. The difficulty in fabricating LEDs that cannot be soldered has resulted in the development of a new class of LEDs which separates the thermal path from the electrical path. Such LEDs are characterized by having an integral heat sink separate from the electrical leads.

When operated at the higher currents typical for such advanced LEDs (on the order of 250 mA) the forward voltage drop across the device (typically 2.5 volts) rises significantly above the nominal 1.85 volts of the same device operated at more normal currents of 25 mA per device. This non-linear increase in device dissipation at higher power levels makes efficient heat removal a priority. Heat rejection from the LED is particularly important as the luminous output may decrease approximately 1% per degree C. in temperature rise, and permanent degradation (aging) of LED is an exponential function of operating temperature.

As an example, the highly capable Hewlett Packard/Lumileds high flux emitter is commonly mounted onto a metal core printed circuit board, as noted in Hewlett Packard data sheets for the HPWL-MDXX family of devices. Examination of this product shows adhesive attachment of each LED in the array to a laminate (circuit board) which is then adhesively bounded on to an aluminum heat dissipater or heat sink. However, the inherently poor thermal conductivity of the laminate (circuit board) acts as an impediment to the efficient removal of heat from the LED.

SUMMARY OF THE INVENTION AND ADVANTAGES

The subject invention provides an electrically driven light-emitting-diode (LED) lamp assembly comprising an electrically insulating circuit board having opposed first and second surfaces with electrically conductive circuit traces on the first surface of the circuit board. A plurality of LEDs are included with each LED having a heat sink and a pair of electrical leads in electrical engagement with the traces. A heat dissipater is disposed in parallel relationship to the circuit board. The assembly is characterized by the circuit board presenting a hole therethrough and around each LED with the heat sink of each LED being disposed in thermal contact with the heat dissipater for conveying heat from the LEDs to the heat dissipater.

The invention also includes a method of fabricating the assembly characterized by disposing each LED in the hole through the circuit board and around each LED with the heat sink of each LED being disposed in thermal contact with the heat dissipater for conveying heat from the LEDs to the heat dissipater.

Accordingly, the subject invention provides an unique combination wherein the integral heat sink of an LED has direct thermal conductivity with the heat dissipater, either by direct contact or through a thermal coupling.

BRIEF DESCRIPTION OF THE DRAWINGS

Other advantages of the present invention will be readily appreciated, as the same becomes better understood by reference to the following detailed description when considered in connection with the accompanying drawings wherein:

FIG. 3 is a cross sectional view of a third embodiment; and

FIG. 4 is a cross sectional view of a fabrication step.

DETAILED DESCRIPTION OF THE PREFERRED EMBODIMENT

Figure 1:
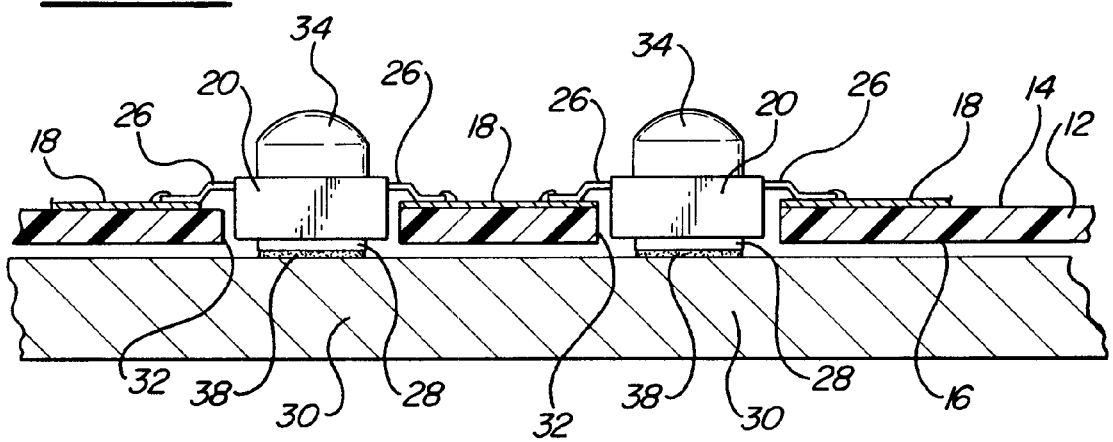
FIG. 1 is a cross sectional view of a first embodiment.
Figure 2:
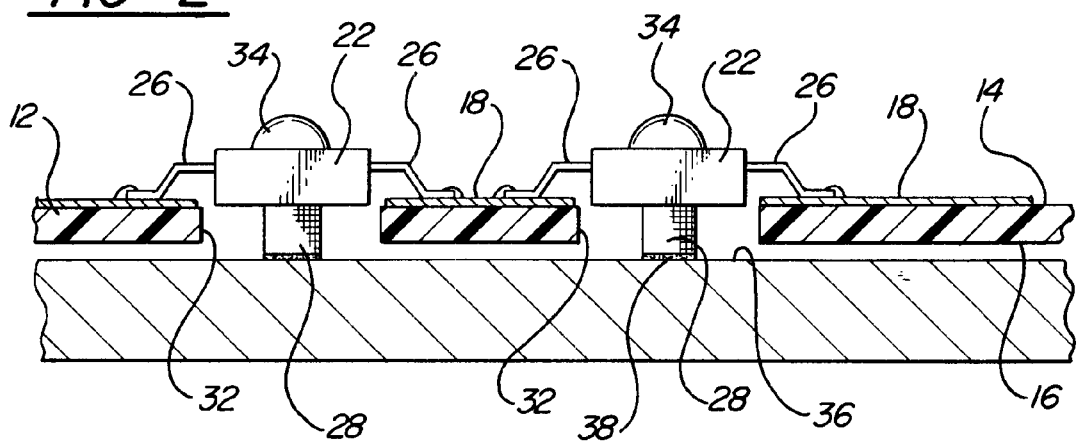
FIG. 2 is a cross sectional view of a second embodiment.

Referring to the Figures, wherein like numerals indicate like or corresponding parts throughout the several views, an electrically driven light-emitting-diode (LED) lamp assembly is shown in cross section in each of FIGS. 1 through 3.

The assembly includes an electrically insulating circuit board 12 having opposed first and second surfaces 14 and 16. The circuit board 12 is of the type well known in the art, e.g., a compressed fiber-board. A plurality of electrically conductive circuit traces 18 are disposed on the first surface 14 of the circuit board 12. The traces 18 are typically copper circuits etched onto the first surface 14 of the circuit board 12, as well known in the art.

The assembly includes anyone or more of a plurality of light emitting diodes (LEDs) 20, 22 or 24 each having a pair of electrical leads 26 in electrical engagement with the traces 18. The electrical engagement between the leads 26 and the traces 18 may be by an electrically conductive adhesive or the traditional solder. Each of the LEDs 20, 22 or 24 includes an integral heat sink 28. The heat sink is an intimate part of the LED and is manufactured therewith.

A heat dissipater 30 is disposed in parallel relationship to the circuit board 12 and consists of a metallic or metal material defining a plate or sheet. The assembly is characterized by the circuit board 12 presenting a hole 32 therethrough and around each LED 20, 22 or 24, i.e., a hole 32 surrounds each LED 20, 22 or 24. The heat sink 28 of each LED 20, 22 or 24 is disposed in thermal contact with the heat dissipater 30 for conveying heat from the LEDs 20, 22 and 24 to the heat dissipater 30. In other words, each LED 20, 22 or 24 extends through the hole 32 in the circuit board 12 with the light emitting portion or lens 34 extending from one of the first and second surfaces 14 or 16 of the circuit board 12 and the heat sink 28 extending from the other one of the first and second surfaces 14 or 16 of the circuit board 12. In most cases the heat dissipator will be metallic and usually made of aluminum or copper, which exhibit excellent thermal conduction. Using well known thermal coupling techniques including thermal grease, thermally conductive adhesives or thermally conductive viscoelastic materials, the thermal impedance between the LED heat sink element and the heat dissipater may be minimized.

The heat sink 28 presents an area or bottom which faces the heat dissipater 30 and a thermal coupling agent 36 or 38 is disposed between the heat sink 28 and the heat dissipater 30 for providing a full thermal path between the heat sink 28 and the heat dissipater 30 over the entirety of this area of the heat sink 28. In most cases the heat dissipater will be metallic and usually made of aluminum or copper, which exhibit excellent thermal conduction. Using well known thermal coupling techniques including thermal grease, thermally conductive adhesives or thermally conductive viscoelastic materials, the thermal impedance between the LED heat sink 28 and the heat dissipater 30 may be minimized.

In the electrical isolation provided in the aforementioned Hewlett Packard LED design by the use of a diamond die isolation wafer, the main heat extraction facility of the LED is electrically isolated from either the anode or cathode connection, i.e., the leads. In view of this isolation, this family of LEDs may be directly mounted onto a conductive metallic heat dissipater 30 as shown in FIG. 1. On the other hand, a competing design by Everlight, while not as thermally efficient as the Hewlett Packard design, are an order of magnitude less costly. But the absence of electrical isolation of the heat sink member in the Everlight LED from the electrical leads requires that the external isolation provisions be made at the heat dissipater interface. The isolation of each LED in an array of LEDs is important because of the series-parallel connection of LEDs in such arrays. If the heat sink element of each LED were not electrically isolated from the electrical leads of the device then direct attachment of a multiplicity of LEDs to a common metal substrate could short circuit the LEDs. As noted in the aforementioned U.S. Pat. Nos. 5,785,418 and 5,857,767 such electrical isolation can be provided by a thin screen-printed insulation layer 32. This is illustrated in FIG. 2 wherein the thermal coupling agent 38 is also an electrical insulator and applied in a thin layer or film on the heat dissipater 30.

The circuit board 12 is spaced from the heat dissipater 30 as the LED heat sink 28 extends beyond the adjacent surface 14 or 16 of the circuit board 12. The second surface 16 of the circuit board 12 faces the heat dissipater 30 in FIGS. 1 and 2 where the electrical leads 26 are secured to the traces 18 on the first surface, which faces away from the heat dissipater 30. In FIG. 3, the first surface 14 of the circuit board 12 with the electrical leads 26 secured to the traces 18 thereon faces the heat dissipater 30. The traces 18, albiet facing the heat dissipater 30, are spaced from the heat dissipater 30 in FIG. 3. In the case where the thermal coupling 36 is only thermally conductive, it need only cover the area between the LED heat sink 28 and the heat dissipater 30 and not a film or layer covering the entire area or surface f the heat dissipater 30 as in FIG. 2.

Heat dissipaters 30 with screen printed circuit traces 18 disposed directly thereon can also be used with heat sink 28 equipped LEDs. An aperture in the screen-printed insulation coating may provide the direct connection between the LED heat sink 28 and the heat dissipater 30. Naturally, unless isolated LEDs are used, some form of electrical insulation between the heat sink 28 of the LEDs and the metal heat dissipater 30 is required.

The invention also presents a method of fabricating an electrically driven light-emitting-diode (LED) lamp assembly with LEDs 20, 22 or 24 having a heat sink 28. The method comprises the steps of disposing a plurality of LEDs 20, 22 or 24 each having a pair of electrical leads 26 in electrical engagement with electrically conductive circuit traces 18 on a first surface 14 of an electrically insulating circuit board 12 and disposing a heat dissipater 30 in parallel relationship to the circuit board 12. The method is characterized by disposing each LED 20, 22 or 24 in a hole 32 through the circuit board 12 and around each LED 20, 22 or 24 while disposing the heat sink 28 of each LED 20, 22 or 24 in thermal contact with the heat dissipater 30 for conveying heat from the LEDs 20, 22 or 24 to the heat dissipater 30.

As indicated above, the method may also include disposing a thermal coupling agent 36 or 38 between the heat sink 28 and the heat dissipater 30 for providing a full thermal path between the heat sink 28 and the heat dissipater 30 over the entirety of the area of the heat sink 28. In some instances this step may comprise disposing a thermal coupling agent 38 that is also an electrical insulator between the heat sink 28 and the heat dissipater 30 for providing a full thermal path between the heat sink 28 and the heat dissipater 30 over the entirety of the area of the heat sink 28 while preventing electrical current between adjacent heat sinks 28.

As alluded to above, the method includes spacing the circuit board 12 from the heat dissipater 30 with the first surface 14 having the traces 18 thereon facing the heat dissipater 30, as in FIG. 3.

Conventional soldering methods are often used to connect the LED leads 26 to a circuit board 12. However, care must be exercised to prevent solder process heat from entering the LED heat sink 28 and damaging the LED. The LEDs that use such high efficiency heat sinks 28 are generally provided with high thermal impedance leads 26 (relative to the heat sink) that essentially prevent damaging heat flow through the leads 26 to the LED. That is, the leads 26 may be soldered conventionally, i.e., manually, flow soldered or reftow soldered, without damaging the LED. However, if flow soldering or reflow soldering is used, some means of limiting the heat input to the LED heat sink 28 must be employed. Accordingly, another step of the present invention to protect the LED from damage during soldering operations by masking or covering the heat sink 26 of the LEDs with a removable hood, cap, cup or cover 40, i.e., disposing a thermally insulating cap 40 around the heat sink 28 while disposing the LED 24 on the circuit board 12. A cap 40 of high temperature silicone rubber or ceramic surrounds the heat sink 28 of the LED 24 while the leads 26 are soldered to the circuit traces 18. Naturally, this step is unnecessary if the leads are soldered manually and the heat sink is not subjected to evaluated temperature. Once the LED assembly is soldered, the protective caps 40 are removed before the LEDs 24 are attached to the heat dissipater 30.

Obviously, many modifications and variations of the present invention are possible in light of the above teachings. The invention may be practiced otherwise than as specifically described within the scope of the appended claims, wherein that which is prior art is antecedent to the novelty set forth in the "characterized by" clause. The novelty is meant to be particularly and distinctly recited in the "characterized by" clause whereas the antecedent recitations merely set forth the old and well-known combination in which the invention resides. These antecedent recitations should be interpreted to cover any combination in which the incentive novelty exercises its utility. In addition, the reference numerals in the claims are merely for convenience and are not to be read in any way as limiting.

What is claimed is:

1. An electrically driven light-emitting-diode (LED) lamp assembly comprising;

an electrically insulating circuit board (12) having opposed first and second surfaces (14 and 16), electrically conductive circuit traces (18) on said first surface (14) of said circuit board (12), a plurality of LEDs (20, 22 or 24) each having a pair of electrical leads (26) in electrical engagement with said traces (18), each of said LEDs (20, 22 or 24) including a heat sink (28), a heat dissipater (30) disposed in parallel relationship to said circuit board (12), said assembly characterized by said circuit board (12) presenting a hole (32) therethrough and around each LED (20, 22 or 24), and said heat sink (28) of each LED (20, 22 or 24) being disposed in thermal contact with said heat dissipater (30) for conveying heat from said LEDs (20, 22 or 24) to said heat dissipater (30).

2. An assembly as set forth in claim 1 wherein said heat sink (28) presents an area facing said heat dissipater (30) and including a thermal coupling agent (36 or 38) between said heat sink (28) and said heat dissipater (30) for providing a full thermal path between said heat sink (28) and said heat dissipater (30) over the entirety of said area of said heat sink (28).

3. An assembly as set forth in claim 2 wherein said thermal coupling agent (38) is an electrical insulator.

4. An assembly as set forth in claim 1 wherein said circuit board (12) is spaced from said heat dissipater (30).

5. An assembly as set forth in claim 1 wherein said second surface 16 of said circuit board (12) faces said heat dissipater (30).

6. An assembly as set forth in claim 1 wherein said first surface (14) of said circuit board (12) with said traces (18) thereon faces said heat dissipater (30).

7. An assembly as set forth in claim 6 wherein said traces (18) are spaced from said heat dissipater (30).

8. A method of fabricating an electrically driven light-emitting-diode (LED) lamp assembly with LEDs (20, 22 or 24) having a heat sink (28), said method comprising the steps of;

disposing a plurality of LEDs (20, 22 or 24) each having a pair of electrical leads (26) in electrical engagement with electrically conductive circuit traces (18) on a first surface (14) of an electrically insulating circuit board (12), and disposing a heat dissipater (30) in parallel relationship to the circuit board (12), said method characterized by disposing each LED (20, 22 or 24) in a hole (32) through the circuit board (12) and around each LED (20, 22 or 24) with the heat sink (28) of each LED (20, 22 or 24) being disposed in thermal contact with the heat dissipater (30) for conveying heat from the LEDs (20, 22 or 24) to the heat dissipater (30).

9. A method as set forth in claim 8 including disposing a thermal coupling agent (36 or 38) between the heat sink (28) and the heat dissipater (30) for providing a full thermal path between the heat sink (28) and the heat dissipater (30) over the entirety of the area of the heat sink (28).

10. A method as set forth in claim 8 including disposing a thermal coupling agent (38) that is an electrical insulator between the heat sink (28) and the heat dissipater (30) for providing a full thermal path between the heat sink (28) and the heat dissipater (30) over the entirety of the area of the heat sink (28) while preventing electrical current between adjacent heat sink (28).

11. A method as set forth in claim 8 including spacing the circuit board (12) from the heat dissipater (30).

12. A method as set forth in claim 8 including spacing the circuit board (12) from the heat dissipater (30) with the first surface (14) having the traces (18) thereon facing the heat dissipater (30).

13. A method as set forth in claim 8 including disposing a thermally insulating cap (40) around the heat sink (28) while disposing the LED (24) on the circuit board (12).

14. A method as set forth in claim 13 including soldering the leads (26) to the circuit traces (18).

* * * * *

UNITED STATES PATENT AND TRADEMARK OFFICE
CERTIFICATE OF CORRECTION

| | | |
|---|---|---|
| PATENT NO. | : 6,428,189 B1 | Page 1 of 1 |
| APPLICATION NO. | : 09/685393 | |
| DATED | : August 6, 2002 | |
| INVENTOR(S) | : Peter A. Hochstein | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 92 days.

Signed and Sealed this
Twelfth Day of February, 2013

Teresa Stanek Rea
*Acting Director of the United States Patent and Trademark Office*